(12) United States Patent
Na et al.

(10) Patent No.: US 11,846,416 B2
(45) Date of Patent: Dec. 19, 2023

(54) DEVICE AND METHOD FOR SELECTING OPTIMAL BOILER COMBUSTION MODEL

(71) Applicant: DOOSAN ENERBILITY CO., LTD., Changwon-si (KR)

(72) Inventors: Sang Gun Na, Yongin-si (KR); Jwa Young Maeng, Yongin-si (KR)

(73) Assignee: DOOSAN ENERBILITY CO., LTD., Changwon (KR)

( * ) Notice: Subject to any disclaimer, the term of this patent is extended or adjusted under 35 U.S.C. 154(b) by 605 days.

(21) Appl. No.: 16/888,567

(22) Filed: May 29, 2020

(65) Prior Publication Data
US 2021/0010671 A1 Jan. 14, 2021

(30) Foreign Application Priority Data
Jul. 11, 2019 (KR) .......................... 10-2019-0083935

(51) Int. Cl.
*F22B 35/00* (2006.01)
*F23C 10/28* (2006.01)
(Continued)

(52) U.S. Cl.
CPC ............. *F22B 35/008* (2013.01); *B60H 1/03* (2013.01); *B60H 1/032* (2013.01); *F22B 35/18* (2013.01);
(Continued)

(58) Field of Classification Search
CPC . B60H 1/032; B60H 1/03; F22B 35/18; F22B 35/008; G05B 13/04;
(Continued)

(56) References Cited

U.S. PATENT DOCUMENTS

2001/0032026 A1* 10/2001 Shigemasa ............. G05B 11/32
  700/287
2015/0058568 A1* 2/2015 Fong ..................... G06F 3/0605
  711/122
(Continued)

FOREIGN PATENT DOCUMENTS

JP 2011-144753 A1 7/2011
KR 10-2012-0076211 A 7/2012
(Continued)

*Primary Examiner* — Kenneth M Lo
*Assistant Examiner* — Tameem D Siddiquee
(74) *Attorney, Agent, or Firm* — Harvest IP Law, LLP

(57) ABSTRACT

A device and method select an optimal boiler combustion model from among a plurality of boiler combustion models for boiler combustion to update a memory in which the boiler combustion models are stored. The device includes a memory configured to store first boiler combustion models that are derived in advance and second boiler combustion models that are derived in advance; and a processor configured to select an optimal boiler combustion model from among the first and second boiler combustion models and to update the memory according to characteristics of the selected optimal boiler combustion model. The processor may further generate a third boiler combustion model for the combustion of the boiler to select the optimal boiler combustion model from among the first to third boiler combustion models and verification data for model verification through the latest data measured in the boiler and data on basic characteristics of the measured data.

18 Claims, 6 Drawing Sheets

(51) Int. Cl.
*G06F 30/20* (2020.01)
*G06F 17/18* (2006.01)
*G06K 9/62* (2022.01)
*B60H 1/03* (2006.01)
*F22B 35/18* (2006.01)
*G05B 13/04* (2006.01)

(52) U.S. Cl.
CPC ........ *G05B 13/04* (2013.01); *F24D 2200/062* (2013.01)

(58) Field of Classification Search
CPC .... F24D 2200/062; F23N 5/265; G06F 30/20; G06F 8/654; G06Q 10/04; G06Q 50/06
See application file for complete search history.

(56) References Cited

U.S. PATENT DOCUMENTS

| | | | |
|---|---|---|---|
| 2016/0091203 A1* | 3/2016 | Wang | F23N 1/022 700/274 |
| 2016/0274978 A1* | 9/2016 | Strohmenger | G05B 15/02 |
| 2017/0068886 A1* | 3/2017 | Cheng | G05B 19/042 |
| 2018/0012137 A1* | 1/2018 | Wright | G05B 13/0265 |
| 2019/0385070 A1* | 12/2019 | Lee | F24F 11/38 |
| 2020/0363776 A1* | 11/2020 | Burroughs | H04L 12/2827 |

FOREIGN PATENT DOCUMENTS

| | | |
|---|---|---|
| KR | 2016-0104481 A | 9/2016 |
| KR | 10-2018-0125276 A | 11/2018 |
| KR | 2019-0048840 A | 5/2019 |

\* cited by examiner

DEVICE AND METHOD FOR SELECTING OPTIMAL BOILER COMBUSTION MODEL

CROSS-REFERENCE TO RELATED APPLICATION

This application claims priority to Korean Patent Application No. 10-2019-0083935, filed on Jul. 11, 2019, the disclosure of which is incorporated herein by reference in its entirety.

BACKGROUND OF THE DISCLOSURE

Technical Field

Exemplary embodiments relate to a device and method for selecting an optimal boiler combustion model, and more particularly, to a device and method for selecting an optimal boiler combustion model from among a plurality of boiler combustion models for boiler combustion to update a memory in which the boiler combustion models are stored.

Related Art

Various types of power plants for power generation may include hydroelectric power plants, thermal power plants, solar power plants, and wind power plants. Among these, thermal power plants may generate electrical power by burning fuel, for example, coal.

Meanwhile, exothermic reactions are chemical reactions that release energy, for example, through heat. Boilers in coal-fired thermal power plants use exothermic reactions to heat water and produce steam necessary for power generation. Problems in power generation utilizing a coal-fired thermal power plant include contaminated exhaust gas and combustion inefficiency.

SUMMARY OF THE DISCLOSURE

Aspects of one or more exemplary embodiments provide a device and method for selecting an optimal boiler combustion model from among a plurality of boiler combustion models for boiler combustion in order to update the boiler combustion models that are prestored in a memory.

In addition to the aspects of the exemplary embodiments mentioned above, other features and advantages of the disclosure are described below and can be clearly understood by those skilled in the art to which the disclosure pertains from the following description.

According to an aspect of an exemplary embodiment, there is provided a device for selecting an optimal boiler combustion model for combustion of a boiler. The device may include a memory configured to store first boiler combustion models that are derived in advance and second boiler combustion models that are derived in advance; and a processor configured to select an optimal boiler combustion model from among the first and second boiler combustion models and to update the memory according to characteristics of the selected optimal boiler combustion model.

The processor may be further configured to generate a third boiler combustion model for the combustion of the boiler and to select the optimal boiler combustion model from among the first to third boiler combustion models.

The processor may be further configured to generate verification data for model verification through the latest data measured in the boiler and data on basic characteristics of the measured data.

The processor may be further configured to compare an output value of each of the first to third boiler combustion models with verification data generated for model verification, and to select, as the optimal boiler combustion model, a boiler combustion model with the least error from the latest data.

The processor may be further configured to calculate an error between an output value for each model and verification data using at least one of first to fifth equations. The first equation may calculate a mean square difference between the output value for each model and the verification data to indicate the calculated value as one error. The second equation may calculate a mean square difference between the output value for each model and the verification data and may further calculate a square root of the mean to indicate the calculated value as one error. The third equation may calculate a sum of squared differences between the output value for each model and the verification data to indicate the calculated value as one error. The fourth equation may calculate a sum of absolute differences between the output value for each model and the verification data to indicate the calculated value as one error. The fifth equation may calculate a mean absolute difference between the output value for each model and the verification data to indicate the calculated value as one error.

The processor may be further configured to update the memory according to which among the first to third boiler combustion models is the selected optimal boiler combustion model.

The processor may be further configured to not update the memory when the selected optimal boiler combustion model includes any one of the first boiler combustion models.

The selected optimal boiler combustion model may include any one of the second boiler combustion models, whereupon the processor may be further configured to store in the memory the optimal boiler combustion model as the most recently derived boiler combustion model.

The selected optimal boiler combustion model may include the third boiler combustion model, whereupon the processor may be further configured to update the memory by replacing the earliest derived boiler combustion model, from among the second boiler combustion models stored in the memory, with the optimal boiler combustion model.

The selected optimal boiler combustion model may include the third boiler combustion model, whereupon the processor may be further configured to delete the earliest derived second boiler combustion model from among the second boiler combustion models stored in the memory, and to store in the memory the optimal boiler combustion model as the most recently derived boiler combustion model.

The memory may have a hierarchical structure and may include a memory space in which the boiler combustion models are stored from a higher layer to a lower layer of the memory in the order in which they are derived.

According to an aspect of another exemplary embodiment, there is provided a method of selecting an optimal boiler combustion model for combustion of a boiler. The method may include storing, in a memory, first boiler combustion models and second boiler combustion models that are derived in advance; selecting an optimal boiler combustion model from among the first and second boiler combustion models; and updating the memory according to the characteristics of the selected optimal boiler combustion model.

The method may further include generating a third boiler combustion model for the combustion of the boiler, wherein the selecting includes selecting the optimal boiler combustion model from among the first to third boiler combustion models.

The selecting may include generating verification data for model verification through the latest data measured in the boiler and data on basic characteristics of the measured data. The selecting may include comparing an output value of each of the first to third boiler combustion models with verification data generated for model verification, and selecting, as the optimal boiler combustion model, a boiler combustion model with the least error from the latest data. The selecting may include calculating an error between an output value for each model and verification data using at least one of the above-mentioned first to fifth equations.

The updating may include updating the second boiler combustion models stored in the memory according to which among the first to third boiler combustion models is the selected optimal boiler combustion model. The updating may include not updating the memory when the selected optimal boiler combustion model includes any one of the first boiler combustion models.

The updating may include storing in the memory the optimal boiler combustion model as the most recently derived boiler combustion model in cases where the selected optimal boiler combustion model includes any one of the second boiler combustion models. In cases where the selected optimal boiler combustion model includes the third boiler combustion model, the updating may include updating the memory by replacing the earliest derived boiler combustion model, from among the second boiler combustion models stored in the memory, with the optimal boiler combustion model.

It is to be understood that both the foregoing general description and the following detailed description of exemplary embodiments are exemplary and explanatory and are intended to provide further explanation of the disclosure as claimed.

BRIEF DESCRIPTION OF THE DRAWINGS

The above and other aspects will become more apparent from the following description of the exemplary embodiments with reference to the accompanying drawings, in which.

DETAILED DESCRIPTION OF THE DISCLOSURE

Hereinafter, various embodiments will be described in detail with reference to the accompanying drawings so that those skilled in the art can easily carry out the disclosure. It should be understood, however, that the disclosure may be embodied in different forms and the disclosure is not limited to the embodiments described herein.

Boilers in coal-fired thermal power plants use exothermic reactions to heat water and produce steam necessary for power generation. In this case, contaminated exhaust gas such as nitrogen oxide is generated, and the generation of a large amount of contaminated exhaust gas increases processing costs. In addition, the incomplete combustion of coal reduces combustion efficiency and thus increases the cost of power generation and operation. Therefore, to reduce contaminated exhaust gas while increasing combustion efficiency, a system for optimizing boiler combustion is needed.

First, a system for optimizing boiler combustion according to the present disclosure will be explained with reference to FIG. 1.

Figure 1:
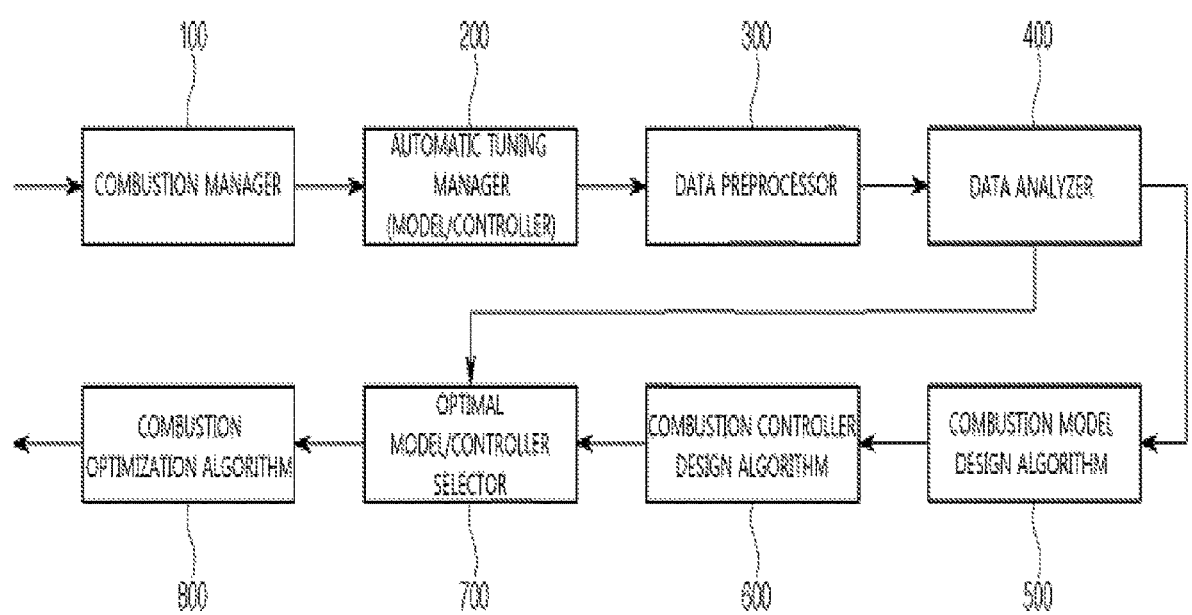
FIG. 1 a block diagram of a system for optimizing boiler combustion according to the present disclosure.

Referring to FIG. 1, the system for optimizing boiler combustion may include a combustion manager 100, an automatic tuning manager (model/controller) 200, a data preprocessor 300, a data analyzer 400, a combustion model design algorithm 500, and a combustion controller design algorithm 600, an optimal model/controller selector 700, and a combustion optimization algorithm 800.

The combustion manager 100 may comprehensively manage combustion optimization. Specifically, the combustion manager 100 may determine whether to perform combustion optimization based on tag data information measured or calculated in real time. In addition, when the combustion manager 100 is used in a power plant, it may determine whether to perform combustion optimization based on DCS values, such as output of power generation, output change condition, whether a soot blower is operated, and boiler logic operation.

The automatic tuning manager (model/controller) 200 may manage combustion models and combustion controllers. Specifically, the automatic tuning manager 200 may determine whether to tune combustion models and combustion controllers based on a variety of information and information sources. For example, the models and controllers may be tuned based on tag data information measured or calculated in real time, a determination as to whether combustion optimization is performed, and a determination as to whether learning is performed to tune a model or controller. When it is determined that the automatic tuning manager 200 needs to tune the combustion models and the combustion controllers, the automatic tuning manager 200 may execute the combustion model design algorithm 500 and the combustion controller design algorithm 600. On the other hand, when it is determined that the automatic tuning manager 200 does not need to tune the combustion models and the combustion controllers, the automatic tuning manager 200 may not execute the combustion model design algorithm 500 and the combustion controller design algorithm 600.

The data preprocessor 300 may preprocess data using known or prestored tag data information as well as tag data information that is measured or calculated in real time. Specifically, the data preprocessor 300 may perform signal processing, (knowledge-based or data-based) normal data processing, outlier processing, and the like. Through such processing, the data preprocessor 300 may remove noise in the data or delete the types of data that may have an adverse effect on the generation of combustion models or the design of controllers.

The data analyzer 400 may perform sampling to select only important normal data, necessary to design combustion models and controllers, by analyzing data patterns. The data analyzer 400 may select an input variable that has an important effect on model output variables, by analyzing a correlation therebetween to design combustion models.

The combustion model design algorithm 500 may be an algorithm configured to design a combustion model, which is one of the most important elements for optimization of boiler combustion. The combustion model design algorithm 500 may design a combustion model that may predict important combustion variables, such as output of power generation, combustion condition including steam and exhaust gas temperatures, exhaust gas composition, and an amount of oxygen remaining after combustion. The designed combustion model may predict these combustion variables based on inputs such as an input of fuel, an input of air, an air temperature, an input of water, and a water temperature.

The combustion controller design algorithm 600 may be an algorithm configured to design a combustion controller, which is one of the most important elements for optimization of boiler combustion. The combustion controller design algorithm 600 enables the combustion controller designed using combustion models to generate an optimal target value for optimal combustion control.

The optimal model/controller selector 700 may select the most optimal combustion model and combustion controller, from among several existing combustion models and combustion controllers, based on the analysis result of current data.

The combustion optimization algorithm 800 may calculate an optimal target value for combustion optimization by inputting current data into an optimal combustion model and combustion controller. In addition, the combustion optimization algorithm 800 may calculate an optimal control target value or control-related auxiliary value using the current target values and manuals in DCS.

A device for selecting an optimal boiler combustion model according to an exemplary embodiment corresponds to the optimal model/controller selector 700, and may select an optimal model from among a plurality of combustion models and update the selected optimal model to a memory.

Figure 2:
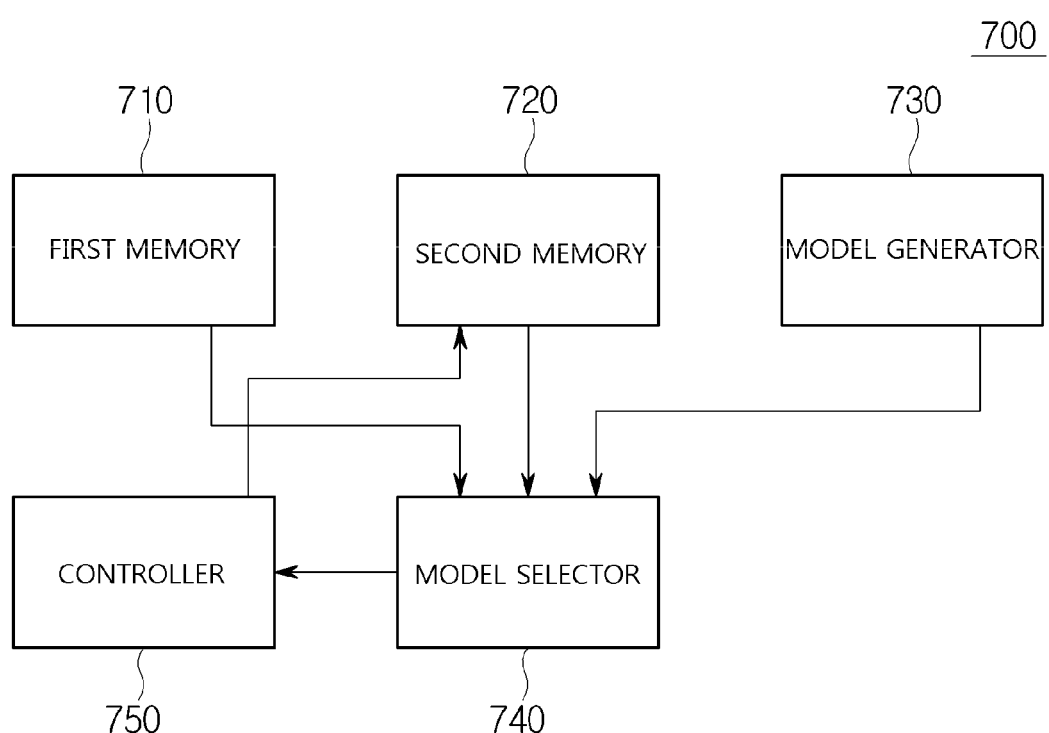
FIG. 2 is a block diagram of a device for selecting an optimal boiler combustion model according to an exemplary embodiment of the present disclosure.

FIG. 2 illustrates the optimal model/controller selector 700 of FIG. 1, which is a device for selecting an optimal boiler combustion model according to an exemplary embodiment.

Referring to FIG. 2, the device 700 may include a first memory 710, a second memory 720, a model generator 730, a model selector 740, and a controller 750.

Each of the first and second memories 710 and 720 refers to a region in which data may be stored and may be referred to as a memory element. In some exemplary embodiments, the first and second memories 710 and 720 may be implemented by one memory element or by separate memory elements, which may include non-volatile memory such as flash memory, FRAM, read-only memory, hard disk drives, magnetic tape, or optical discs.

The model generator 730, the model selector 740, and the controller 750 may be implemented by at least one processor, each of which may include a computer microprocessor. In some exemplary embodiments, the model generator 730, the model selector 740, and the controller 750 may be implemented by one processor, but the present disclosure is not limited thereto. For example, at least two of the model generator 730, the model selector 740, and the controller 750 may be implemented by one processor.

Hereinafter, the functions and operations of the model generator 730, the model selector 740, and the controller 750 as described should be understood to refer to functions and operations performed by a processor or processors configured to implement the model generator 730, the model selector 740, and the controller 750. For example, functions and operations of the model generator 730 may refer to functions and operations performed by a processor configured to implement the model generator 730.

In some exemplary embodiments, at least one processor may each execute one or more programs that stores commands for instructing the functions and operations of the model generator 730, the model selector 740, and the controller 750.

Figure 3:
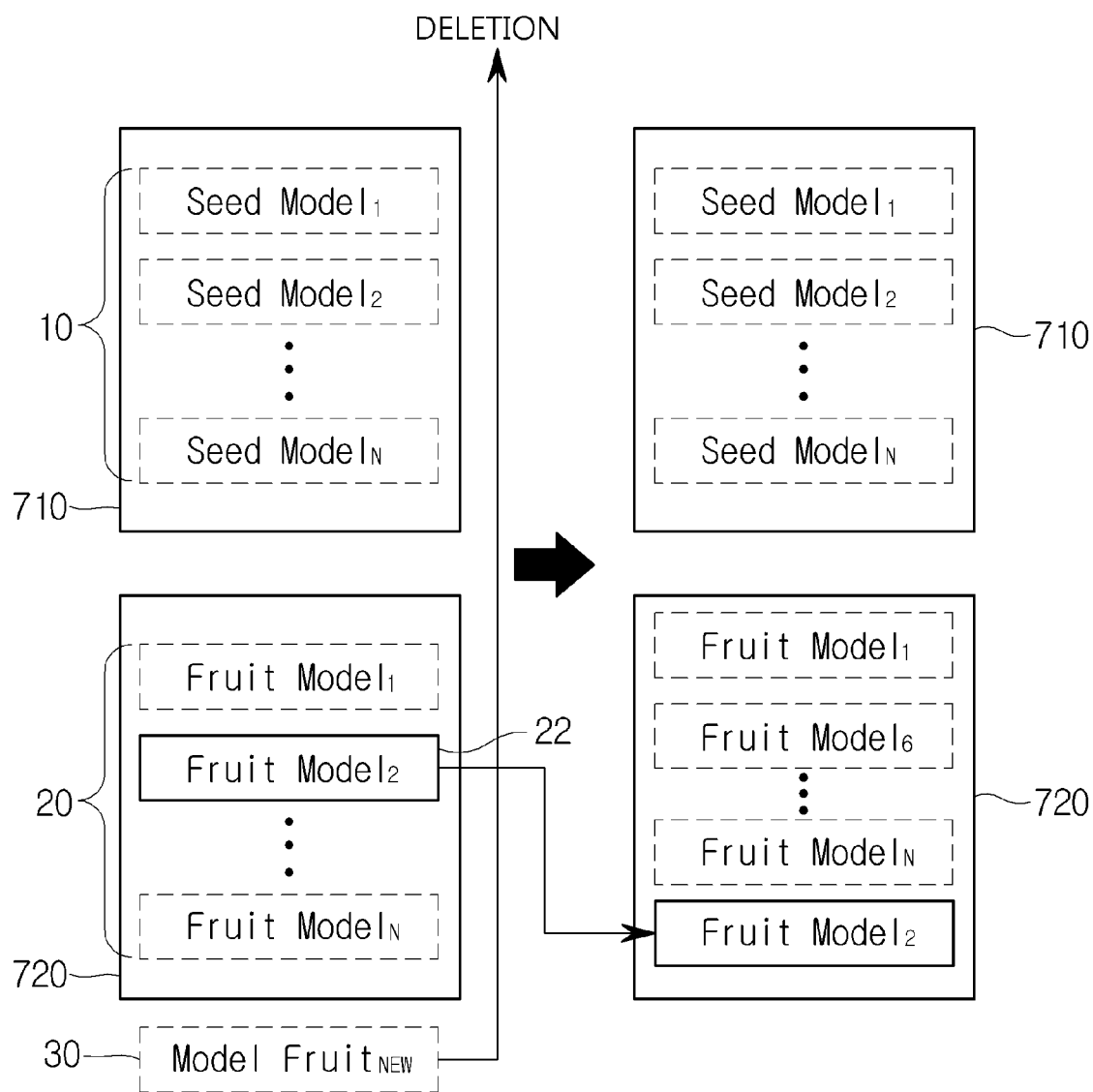
FIGS. 3-5 are diagrams detailing storage in the memories of the device of FIG. 2, illustrating the updating of a memory when selecting an optimal boiler combustion model according to the exemplary embodiment of the present disclosure.
Figure 4:
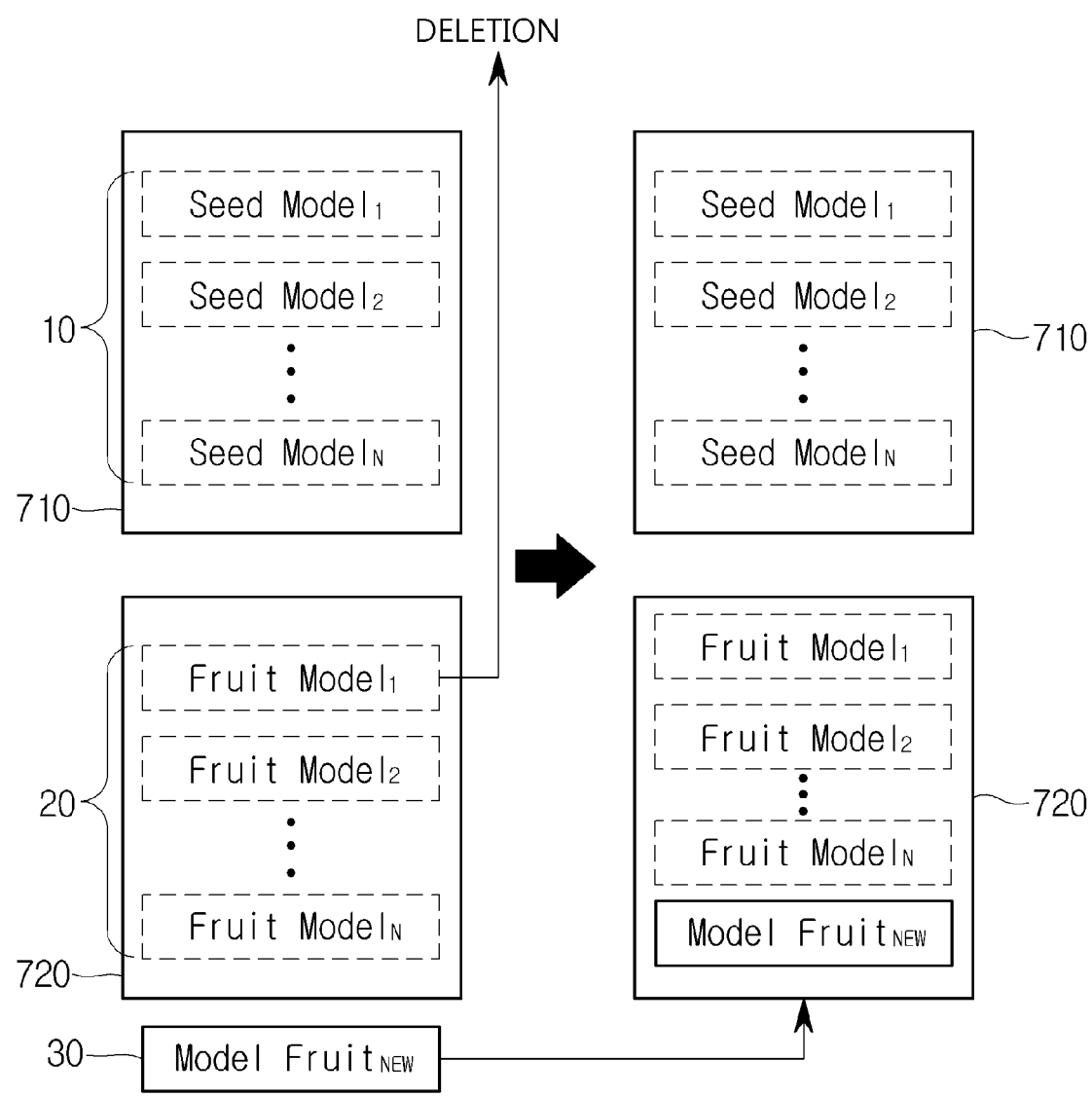
Figure 5:
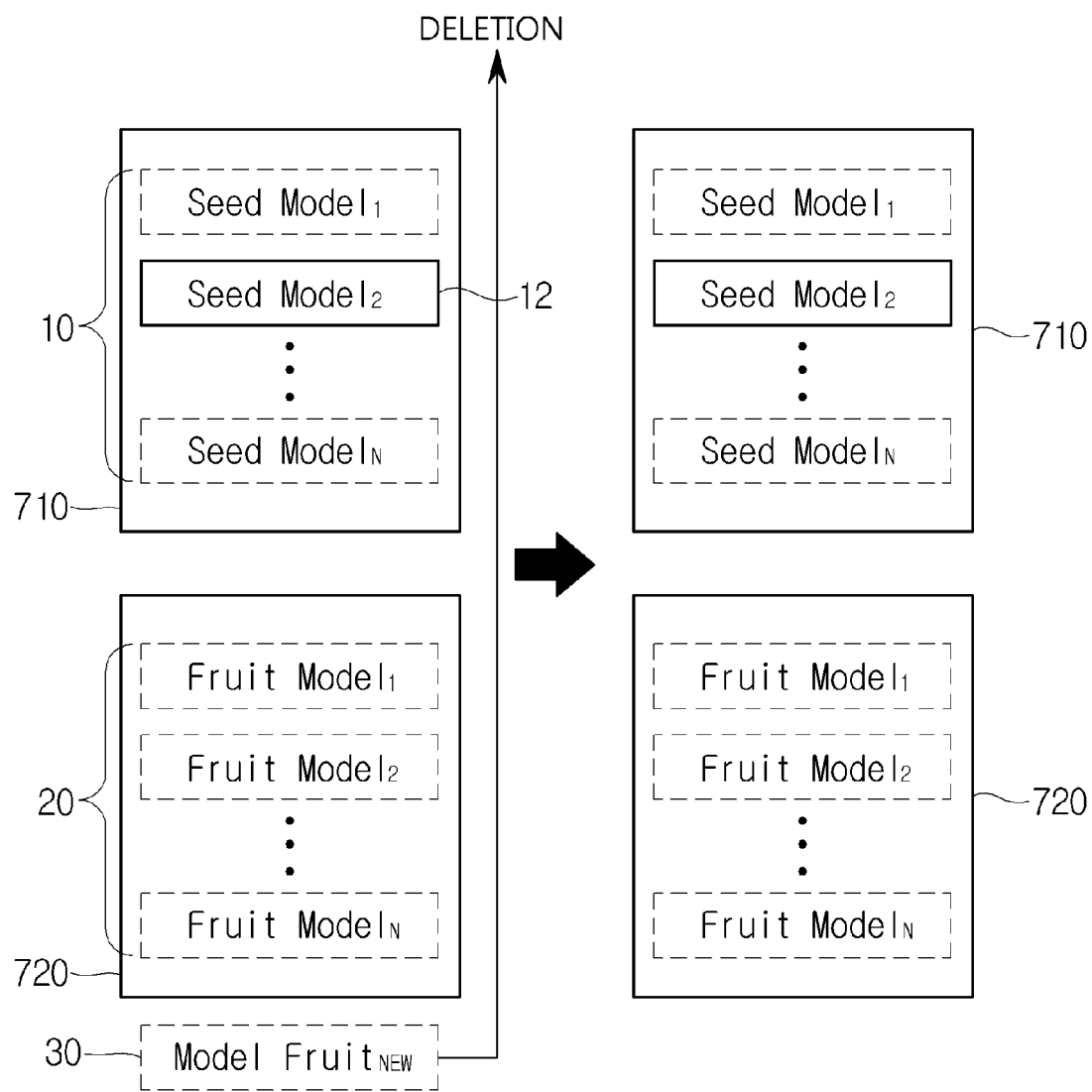

The first memory 710 may store a first boiler combustion model 10 (FIGS. 3-5). Here, the first boiler combustion model 10 may be a preset combustion model as the combustion model that has been generally used for combustion of an existing boiler. For example, the first boiler combustion model 10 may be a combustion model whose performance is verified over a long period of experimentation and operation. The first boiler combustion model 10 may be pre-stored in the first memory 710, for example, when the device is designed. The first boiler combustion model 10 may be manually changed or deleted by an administrator, but it may not be automatically changed or deleted. For example, access to the first memory 710 may be restricted. In addition, the first boiler combustion model 10 may consist of a plurality of first boiler combustion models stored in the first memory 710.

The second memory 720 may store second boiler combustion models 20 (FIGS. 3-5) derived in advance. The second memory 720 may store boiler combustion models 20 that are optimally selected in advance through learning. Here, the first boiler combustion models 10 stored in the first memory 710 may be models verified over a long period of experimentation, and the second boiler combustion models 20 stored in the second memory 720 may be models selected through learning. That is, the second boiler combustion models 20 may be models derived recently, compared to the first boiler combustion models 10. For example, the first boiler combustion models 10 may not be automatically changed by the device 700, whereas the second boiler combustion models 20 may be automatically changed by the device 700. In addition, the second boiler combustion models 20 may be classified according to each component (e.g., a component or coal type of a mixed coal) or each operating condition, and the second memory 720 may store a data set of the second boiler combustion models 20 classified according to each component or each operating condition. The second memory 720 may store a plurality of data sets, and a plurality of second boiler combustion models 20 may be stored in each of the data sets.

The second boiler combustion models 20 in the second memory 720 may be sorted and stored in the order in which they are generated. For example, the second memory 720 may have a hierarchical structure. That is, the second memory 720 may store boiler combustion models from a higher layer to a lower layer of the hierarchical structure in the order in which they are derived. As an example, a first derived second boiler combustion model may be stored in the highest layer (e.g., first layer) of the second memory 720, and a subsequently derived second boiler combustion model may be stored in the second-highest layer (e.g., second layer) of the second memory 720.

The model generator 730 may output a third boiler combustion model 30 (FIGS. 3-5) for boiler combustion to the model selector 740 which will be described later. In some exemplary embodiments, the model generator 730 may receive and output the third boiler combustion model 30 generated by the combustion model design algorithm 500 of FIG. 1. Alternatively, the model generator 730 may generate a third boiler combustion model 30 by itself and output the generated third boiler combustion model 30.

Here, the model generator 730 may generate the third boiler combustion model 30 in the same manner as the combustion model design algorithm 500 of FIG. 1. For example, the model generator 730 may design a combustion model that may predict important combustion variables, such as output of power generation, combustion condition including steam and exhaust gas temperatures, exhaust gas composition, and an amount of oxygen remaining after combustion, based on inputs such as an input of fuel, an input of air, an air temperature, an input of water, and a water temperature.

The third boiler combustion model 30 may be stored in a third memory. The third memory may be a volatile memory such as a cache memory, in which case the third boiler combustion model 30 may be temporarily stored in the third memory. Alternatively, the third boiler combustion model 30 may be stored in the second memory 720, in which case the third boiler combustion model 30 may be deleted in some situations, as will be described later.

The model selector 740 may select an optimal combustion model from among the first boiler combustion models 10, the second boiler combustion models 20, and the third boiler combustion model 30. That is, the optimal boiler combustion model may be one of the first boiler combustion models 10 or one of the second boiler combustion models 20, or may be the third boiler combustion model 30. Here, if the third boiler combustion model 30 is not generated, the model selector 740 may select an optimal combustion model from among the first boiler combustion models 10 and the second boiler combustion models 20.

Specifically, the model selector 740 may generate verification data for model verification by analyzing the patterns of the data output from the boiler. Here, the data output from the boiler is the latest data, and may be the most recently output data from the boiler. According to the present embodiment, the latest data is not limited to only the most recently output data, but may include the types of data before the most recently output data. For example, when the most recently output data is Nth data, the latest data may refer to Nth data, (N−1)th data, N−2)th data, or (N−3)th data. Here, the latest data is not limited in number, which may be set in advance. The model selector 740 may generate verification data for model verification through the latest data and data on basic characteristics, and thus may select a boiler combustion model capable of reflecting the latest operation data of the power plant (or boiler).

The model selector 740 may compare the output value of each of the first to third boiler combustion models 10 to 30 with the verification data, and may select, as the optimal boiler combustion model, a boiler combustion model with the least error from the verification data as a result of the comparison. Here, the verification data may include input data and output data, and the input data of the verification data may be input as input data of each of the boiler combustion models 10, 20, and 30.

The model selector 740 may indicate an error between the output value of each of the first to third boiler combustion models 10 to 30 and the verification data, as one value for each model. As an example, the model selector 740 may calculate a mean square difference between the output value for each model and the verification data, and may indicate the calculated value as one error. In addition, the model selector 740 may calculate a mean square difference between the output value for each model and the verification data, and may calculate a square root of the mean to indicate the calculated value as one error.

In addition, the model selector 740 may calculate a sum of squared differences between the output value for each model and the verification data, thereby indicating the calculated value as one error. Alternatively, the model selector 740 may calculate the error value as a sum of absolute differences between the output value for each model and the verification data or may calculate a mean absolute difference between the output value for each model and the verification data.

The model selector 740 may select a boiler combustion model with the least error, as the optimal boiler combustion model.

In addition, a plurality of boiler combustion models may be verified (or evaluated) using a test data set including test input values/test output values, and an optimal boiler combustion model may be selected from among the boiler combustion models, as a result of the verification result. That is, test input values are input to a plurality of boiler combustion models, so that the calculation results for the test input values may be calculated from the respective boiler combustion models. In addition, the calculation results calculated from the respective boiler combustion models are compared with test output values, so that the boiler combustion models may be verified based on the error between the calculation results and the test output values. Here, the model selector 740 may compare the calculation results, calculated from the respective boiler combustion models, with the test output values, and may select a boiler combustion model with the least error, as the optimal boiler combustion model. The boiler combustion model may be verified and selected through various methods.

The controller 750 may update the second memory 720 according to the characteristics of the optimal boiler combustion model selected by the model selector 740. Specifically, the controller 750 may update the second memory 720 according to which among the first to third boiler combustion models 10 to 30. is the optimal boiler combustion model selected by the model selector 740.

The controller 750 may not update the second memory 720 when the optimal boiler combustion model selected by the model selector 740 is any one of the first boiler combustion models 10. In this case, the controller 750 may keep the capacity of the second memory 720 constant by deleting the third boiler combustion model 30 without storing the third boiler combustion model 30 in the second memory 720. Here, when the optimal boiler combustion model is selected without the generation of the third boiler combustion model 30, the operation may be omitted in which the controller 750 stores or deletes the third boiler combustion model 30.

In addition, since the first boiler combustion model 10 is a model that is already verified over a long period of time and the third boiler combustion model 30 is a model generated through learning, it is not necessary to store the third boiler combustion model 30, which is not verified, when the first boiler combustion model 10 is selected as an optimal boiler combustion model. Thus, it is possible to optimize the combustion of the boiler by deleting the third boiler combustion model 30 and using the first boiler combustion model 10, stored in the first memory 710, as an optimal boiler combustion model.

In addition, when the optimal boiler combustion model selected by the model selector 740 is any one of the second boiler combustion models 20, the controller 750 may store, as the most recently derived boiler combustion model, the optimal boiler combustion model in the second memory 720. That is, when the optimal boiler combustion model is the second boiler combustion model 20, the controller 750 may arrange (or store) the optimal boiler combustion model in the lowest layer of the second memory 720, so that the performance of the second boiler combustion model 20 stored in the second memory 720 can be improved. In this case, the controller 750 may delete the third boiler combustion model 30. As the third boiler combustion model 30 is deleted, the capacity of the second memory 720 may be kept constant. Here, when the optimal boiler combustion model is selected without the generation of the third boiler combustion model 30, the operation may be omitted in which the controller 750 stores or deletes the third boiler combustion model 30.

In addition, when the optimal boiler combustion model selected by the model selector 740 is the third boiler combustion model 30, the controller 750 may delete the earliest derived boiler combustion model from among the second boiler combustion models 20 stored in the second memory 720 and may store, as the most recently derived boiler combustion model, the optimal boiler combustion model in the second memory 720. That is, when the optimal boiler combustion model is the third boiler combustion model 30, the controller 750 may delete the earliest derived second boiler combustion model from among the second boiler combustion models 20 stored in the second memory 720 and may store the third boiler combustion model 30, selected as the optimal boiler combustion model, in the second memory 720. That is, the earliest derived second boiler combustion model may be updated as the recently selected third boiler combustion model 30. In this case, the controller 750 may store the third boiler combustion model 30 in the lowest layer of the second memory 720.

In such a manner, the capacity of the second memory 720 may be keep constant, and the earliest derived second boiler combustion model 20 is first deleted in the present embodiment. Therefore, it is possible to prevent a newly derived optimal boiler combustion model from being first deleted since it is stored as the most recently derived boiler combustion model. In other words, since the optimal boiler combustion model is selected through comparison with the latest data of the boiler, the optimal boiler combustion model may be a model that is most similar to the latest condition of the boiler. Accordingly, the selected optimal boiler combustion model may be stored in the lowest layer of the second memory 720, and an optimal boiler combustion model that is then newly selected may be stored in the lowest layer of the second memory 720 again. By repeating these steps, models similar to the latest data of the boiler may be stored in the lower layer of the second memory 720. On the other hand, since the second boiler combustion model 20 stored in the higher layer of the second memory 720 is not selected as an optimal boiler combustion model, the second boiler combustion model 20 may not be updated to the lower layer of the second memory 720, which may mean that the second boiler combustion model 20 is not similar to the latest condition of the boiler. Accordingly, as the third boiler combustion model 30 is selected as an optimal combustion model, the second boiler combustion model in the highest layer of the second memory 720 may be deleted in order to store the third boiler combustion model 30 in the second memory 720.

In addition, the second boiler combustion models 20 stored in the second memory 720 may not be deleted according to the capacity of the second memory 720. For example, when the capacity of the second memory 720 is less than the allowable value and the third boiler combustion model 30 is selected as an optimal boiler combustion model, the controller 750 may store the third boiler combustion model 30 without the deletion of the second boiler combustion models 20. In this case, the third boiler combustion model 30 may be stored in the lowest layer of the second memory 20, as the most recently derived boiler combustion model.

FIG. 3 illustrates a memory being updated when any one of the first boiler combustion models is selected as an optimal boiler combustion model. Here, the first boiler combustion models 10 include Seed Model$_1$ to Seed Model$_N$, and the second boiler combustion models 20 include Fruit Model$_1$ to Fruit Model$_N$.

Referring to FIG. 3, the first memory 710 may store the first boiler combustion models 10, and the second memory 720 may store the second boiler combustion models 20.

The model selector 740 may select an optimal boiler combustion model from among the first boiler combustion models 10 stored in the first memory 710, the second boiler combustion models 20 stored in the second memory 720, and the third boiler combustion model 30 output from the model generator 730. Here, the model selector 740 may compare the output value of each of the first to third boiler combustion models 10 to 30 with the verification data in which the latest data extracted from the boiler is reflected, and may select, as the optimal boiler combustion model, a boiler combustion model with the least error from the verification data as a result of the comparison.

The controller 750 may not update the first and second memories 710 and 720 when the optimal boiler combustion model selected by the model selector 740 is any one of the first boiler combustion models 10. In addition, the controller 750 may delete the third boiler combustion model 30 output by the model generator 730.

FIG. 4 illustrates a memory being updated when any one of the second boiler combustion models is selected as an optimal boiler combustion model. As in FIG. 3, the first boiler combustion models 10 include models SM$_1$ to SM$_N$, and the second boiler combustion models 20 include models FM$_1$ to FM$_N$.

Referring to FIG. 4, the first memory 710 may store the first boiler combustion models 10, and the second memory 720 may store the second boiler combustion models 20.

The model selector 740 may select an optimal boiler combustion model from among the first boiler combustion models 10 stored in the first memory 710, the second boiler combustion models 20 stored in the second memory 720, and the third boiler combustion model 30 output from the model generator 730. Here, the model selector 740 may compare the output value of each of the first to third boiler combustion models 10 to 30 with the verification data in which the latest data extracted from the boiler is reflected, and may select, as the optimal boiler combustion model, a boiler combustion model with the least error from the verification data as a result of the comparison.

When the optimal boiler combustion model selected by the model selector 740 is any one of the second boiler combustion models 20, the controller 750 may store, as the most recently derived boiler combustion model, the optimal boiler combustion model in the second memory 720. Specifically, the second memory 720 may have a hierarchical structure, and the second boiler combustion model that is first derived may be stored in the higher layer of the second memory 720. When the selected optimal boiler combustion model is the second boiler combustion model 20, the controller 750 may store the second boiler combustion model, selected as the optimal boiler combustion model, in the lowest layer of the second memory 720. In this case, the controller 750 may delete the third boiler combustion model 30 output by the model generator 730.

FIG. 5 illustrates a memory being updated when the third boiler combustion model is selected as an optimal boiler combustion model. As in FIG. 3, the first boiler combustion models 10 include models $SM_1$ to $SM_N$, and the second boiler combustion models 20 include models $FM_1$ to $FM_N$.

Referring to FIG. 5, the first memory 710 may store the first boiler combustion models 10, and the second memory 720 may store the second boiler combustion models 20.

The model selector 740 may select an optimal boiler combustion model from among the first boiler combustion models 10 stored in the first memory 710, the second boiler combustion models 20 stored in the second memory 720, and the third boiler combustion model 30 output from the model generator 730. Here, the model selector 740 may compare the output value of each of the first to third boiler combustion models 10 to 30 with the verification data in which the latest data extracted from the boiler is reflected, and may select, as the optimal boiler combustion model, a boiler combustion model with the least error from the verification data as a result of the comparison.

When the optimal boiler combustion model selected by the model selector 740 is the third boiler combustion model 30, the controller 750 may update the second memory 720 by replacing the earliest derived second boiler combustion model from among the second boiler combustion models with the optimal boiler combustion model.

Here, the second memory 720 may have a hierarchical structure, and the second boiler combustion model that is first derived may be stored in the higher layer of the second memory 720. When the optimal boiler combustion model is the third boiler combustion model 30, the controller 750 may delete the earliest derived second boiler combustion model from among the second boiler combustion models stored in the second memory 720, and may store the third boiler combustion model 30, selected as the optimal boiler combustion model, in the lowest layer of the second memory 720.

Figure 6:
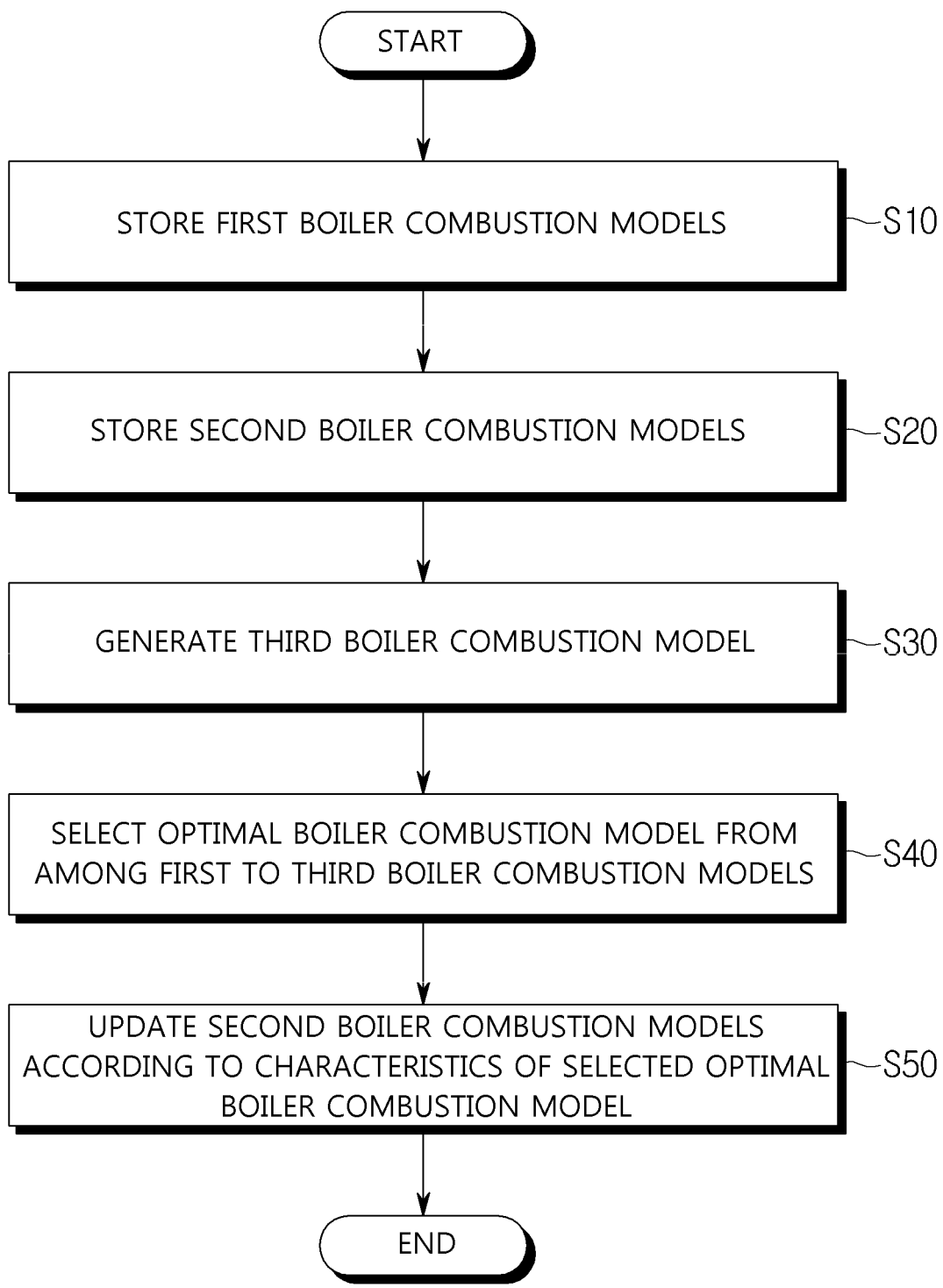
FIG. 6 is a flowchart of a method of selecting an optimal boiler combustion model according to an exemplary embodiment of the present disclosure.

FIG. 6 illustrates a method of selecting an optimal boiler combustion model according to an exemplary embodiment.

Referring to FIG. 6, a first memory 710 may store first boiler combustion models 10 (S10). The first memory 710 may store the first boiler combustion models 10 that are derived in advance, and the first boiler combustion models 10 may be combustion models that have been generally used for boiler combustion in advance. Here, the first memory 710 may have a hierarchical structure, and the first boiler combustion models that are first derived may be stored in the higher layer of the first memory.

A second memory 720 may store second boiler combustion models 20 (S20). The second memory 720 may store the second boiler combustion models 20 that are derived in advance, and the second boiler combustion models 20 may be combustion models that have been selected as the optimal boiler combustion models in advance. Here, the second memory 720 may have a hierarchical structure, and the second boiler combustion models that are first derived may be stored in the higher layer of the second memory.

A model generator 730 may output a third boiler combustion model 30 (S30). Here, the third boiler combustion model 30 is not generated every time, and the process of S30 may thus be omitted.

A model selector 740 may select an optimal boiler combustion model from among the first to third boiler combustion models (S40). The model selector 740 may compare the output value of each of the first to third boiler combustion models 10 to 30 with verification data in which the latest data extracted from the boiler and basic characteristics of the extracted data are reflected. As a result of the comparison, the model selector 740 may select, as the optimal boiler combustion model, a boiler combustion model with the least error from the verification data. Here, when the process of S30 is omitted, the model selector 740 may select an optimal boiler combustion model from among the first and second boiler combustion models 10 and 20.

A controller 750 may update the second memory according to the characteristics of the optimal boiler combustion model selected by the model selector 740 (S50). Specifically, the controller 750 may update the second boiler combustion models stored in the second memory 720 according to which among the first to third boiler combustion models 10 to 30 is the optimal boiler combustion model selected by the model selector 740. That is, the controller 750 may delete the third boiler combustion model 30 and may not update the second memory 720 when the optimal boiler combustion model selected by the model selector 740 is any one of the first boiler combustion models 10.

In addition, when the optimal boiler combustion model selected by the model selector 740 is any one of the second boiler combustion models 20, the controller 750 may update, as the most recently derived boiler combustion model, the optimal boiler combustion model to the second memory 720. That is, when the optimal boiler combustion model is the second boiler combustion model 20, the controller 750 may store the second boiler combustion model, selected as the optimal boiler combustion model, in the lower layer of the second memory 720 to update the second memory 720, and may delete the third boiler combustion model 30.

In addition, when the optimal boiler combustion model selected by the model selector 740 is the third boiler combustion model 30, the controller 750 may delete the earliest derived boiler combustion model from among the second boiler combustion models 20 stored in the second memory 720 and may store, as the most recently derived boiler combustion model, the optimal boiler combustion model in the second memory 720. That is, when the optimal boiler combustion model is the third boiler combustion model 30, the controller 750 may delete the earliest derived second boiler combustion model from among the second boiler combustion models 20 stored in the second memory 720 and may store the third boiler combustion model 30, selected as the optimal boiler combustion model, in the second memory 720. In this case, the controller 750 may store the third boiler combustion model 30 in the lowest layer of the second memory 720.

As described above, according to the exemplary embodiments, it is possible to realize the device and method for selecting an optimal boiler combustion model from among the plurality of boiler combustion models for boiler combustion to update the memory in which the boiler combustion models are stored.

As is apparent from the above description, according to the device and method for selecting an optimal boiler combustion model of the exemplary embodiments, it is possible to select an optimal boiler combustion model from among the plurality of boiler combustion models.

In addition, according to the device and method for selecting an optimal boiler combustion model of the exemplary embodiments, it is possible to automatically update the optimal boiler combustion model selected from the models stored in the memory.

In addition, other features and advantages of the disclosure may also be uncovered through the above-mentioned embodiments.

It should be understood by those skilled in the art that the above-mentioned embodiments are given by way of example only in all aspects and are not intended to limit the scope of the disclosure since various modifications and changes in form and details can be made therein without departing from the spirit and scope as defined by the appended claims. Therefore, the description of the exemplary embodiments should be construed in a descriptive sense only and not to limit the scope of the claims, and many alternatives, modifications, and variations will be apparent to those skilled in the art.

What is claimed is:

1. A device for performing a combustion of a boiler based on an optimal boiler combustion model selected from a fixed number of boiler combustion models, the device comprising
a memory having a hierarchical structure comprising;
a first memory configured to store a first predetermined number of first boiler combustion models that are determined when the boiler is designed, and
a second memory configured to store a second predetermined number of second boiler combustion models that are derived in advance through a learning process, are derived recently compared to the first boiler combustion models, and are classified according to a coal type of a mixed coal, wherein the second memory is updatable and includes a plurality of data sets, each of the plurality of data sets comprises the second combustion models classified according to the coal type of the mixed coal;
a processor configured to;
generate a third boiler combustion model predicting combustion variables including steam temperature, exhaust gas temperature, exhaust gas composition, and an amount of oxygen remaining after combustion based on inputs comprising an input of fuel, an input of air, an air temperature, and an input of water,
select an optimal boiler combustion model from among the first and second boiler combustion models and the third boiler combustion model based on an error of an output value of each of the first and second boiler combustion models and the third boiler combustion model compared to verification data,
delete an earliest derived second boiler combustion model from the second memory and insert the third boiler combustion model to the second memory when the selected optimal boiler combustion model is the third boiler combustion model;
the boiler performs the combustion based on the optimal boiler combustion model.

2. The device according to claim 1, wherein the processor is further configured to store, in the second memory, the optimal boiler combustion as a most recently derived combustion model when the selected optimal boiler combustion model includes any one of the second boiler combustion models stored in the second memory.

3. The device according to claim 1, wherein the processor is further configured to generate the verification data for model verification through the latest data measured in the boiler.

4. The device according to claim 2, wherein the processor is further configured to compare the output value of each of the first to third boiler combustion models with the verification data generated for model verification, and to select, as the optimal boiler combustion model, a boiler combustion model with the least error from the latest data.

5. The device according to claim 2,
wherein the processor is further configured to calculate the error of the output value measured between the output value for each model and the verification data using at least one of first to fifth equations,
wherein the first equation calculates a mean square difference between the output value for each model and the verification data to indicate the calculated value as one error,
wherein the second equation calculates a mean square difference between the output value for each model and the verification data and further calculates a square root of the mean to indicate the calculated value as one error,
wherein the third equation calculates a sum of squared differences between the output value for each model and the verification data to indicate the calculated value as one error,
wherein the fourth equation calculates a sum of absolute differences between the output value for each model and the verification data to indicate the calculated value as one error, and
wherein the fifth equation calculates a mean absolute difference between the output value for each model and the verification data to indicate the calculated value as one error.

6. The device according to claim 2, wherein the processor is further configured to update the second memory when the selected optimal boiler combustion model includes any one of the second or third boiler combustion models stored in the second or third memory respectively.

7. The device according to claim 6, wherein the processor is further configured to not update the second memory when the selected optimal boiler combustion model includes any one of the first boiler combustion models.

8. The device according to claim 6,
wherein the processor is further configured to store in the second memory the optimal boiler combustion model as the most recently derived boiler combustion model when the selected optimal boiler combustion model includes any one of the second boiler combustion models.

9. The device according to claim 6,
wherein the processor is further configured to store in the second memory the optimal boiler combustion model as a most recently derived boiler combustion model when the selected optimal boiler combustion model includes the third boiler combustion model.

10. The device according to claim 1, wherein each of the first and second memory has the hierarchical structure and includes a memory space in which the boiler combustion models are stored from a higher layer to a lower layer of each memory in the order in which they are derived.

11. A method of performing a combustion of a boiler based on an optimal boiler combustion model selected from a fixed number of boiler combustion models, the method comprising:
storing, in a first memory, a first predetermined number of first boiler combustion models that are determined when the boiler is designed;
storing, in a second memory, a second predetermined number of second boiler combustion models that are derived in advance through a learning process, are derived recently compared to the first boiler combustion models, and are classified according to a coal type of a mixed coal, wherein the second memory is updatable and includes a plurality of data sets, each of the plurality of data sets comprises the second combustion models classified according to the coal type of the mixed coal;

generating a third boiler combustion model predicting combustion variables including steam temperature, exhaust gas temperature, exhaust gas composition, and an amount of oxygen remaining after combustion based on inputs comprising an input of fuel, an input of air, an air temperature, and an input of water selecting an optimal boiler combustion model from among the first and second boiler combustion models based on an error of an output value of each of the first and second boiler combustion models compared to verification data;

deleting an earliest derived second boiler combustion model from the second memory and insert the third boiler combustion model to the second memory when the selected optimal boiler combustion model is the third boiler combustion model, performing the combustion of the boiler based on the optimal boiler combustion model.

12. The method according to claim 11, further comprising:

storing, in the second memory, the optimal boiler combustion as a most recently derived combustion model when the selected optimal boiler combustion model includes any one of the second boiler combustion models stored in the second memory.

13. The method according to claim 11, wherein the selecting includes generating the verification data for model verification through the latest data measured in the boiler.

14. The method according to claim 12, wherein the selecting includes:

comparing the output value of each of the first to third boiler combustion models with the verification data generated for model verification, and selecting, as the optimal boiler combustion model, a boiler combustion model with the least error from the latest data.

15. The method according to claim 12, wherein the selecting includes calculating the error of the output value measured between the output value for each model and the verification data using at least one of first to fifth equations, wherein the first equation calculates a mean square difference between the output value for each model and the verification data to indicate the calculated value as one error, wherein the second equation calculates a mean square difference between the output value for each model and the verification data and further calculates a square root of the mean to indicate the calculated value as one error, wherein the third equation calculates a sum of squared differences between the output value for each model and the verification data to indicate the calculated value as one error, wherein the fourth equation calculates a sum of absolute differences between the output value for each model and the verification data to indicate the calculated value as one error, and wherein the fifth equation calculates a mean absolute difference between the output value for each model and the verification data to indicate the calculated value as one error.

16. The method according to claim 12, wherein the updating includes updating the second boiler combustion models stored in the second memory when the selected optimal boiler combustion model includes any one of the second or third boiler combustion models stored in the second or third memory respectively.

17. The method according to claim 16, wherein the updating includes not updating the second memory when the selected optimal boiler combustion model includes any one of the first boiler combustion models.

18. The method according to claim 16, wherein the updating includes storing in the second memory the optimal boiler combustion model as the most recently derived boiler combustion model when the selected optimal boiler combustion model includes any one of the second boiler combustion models.

* * * * *